United States Patent
Myong

(10) Patent No.: US 8,034,656 B2
(45) Date of Patent: Oct. 11, 2011

(54) ANNEALING METHOD OF ZINC OXIDE THIN FILM

(75) Inventor: Seung-Yeop Myong, Seoul (KR)

(73) Assignee: Kisco (KR)

( * ) Notice: Subject to any disclaimer, the term of this patent is extended or adjusted under 35 U.S.C. 154(b) by 93 days.

(21) Appl. No.: 12/396,827

(22) Filed: Mar. 3, 2009

(65) Prior Publication Data
US 2009/0227090 A1   Sep. 10, 2009

(30) Foreign Application Priority Data

Mar. 4, 2008  (KR) .................. 10-2008-0020120

(51) Int. Cl.
*H01L 21/00*  (2006.01)

(52) U.S. Cl. . 438/104; 438/608; 438/660; 457/E21.575; 457/E21.497

(58) Field of Classification Search .......... 438/104, 438/608, 609, 660; 257/E21.575, E21.497
See application file for complete search history.

(56) References Cited

U.S. PATENT DOCUMENTS

| | | | |
|---|---|---|---|
| 6,106,689 A | 8/2000 | Matsuyama | |
| 6,379,994 B1 * | 4/2002 | Sano et al. | 438/96 |
| 6,624,441 B2 * | 9/2003 | Cantwell et al. | 257/43 |
| 2003/0052318 A1 * | 3/2003 | Choi et al. | 257/43 |
| 2004/0191950 A1 * | 9/2004 | Nakamura et al. | 438/98 |
| 2008/0197016 A1 * | 8/2008 | Takizawa et al. | 204/298.02 |

FOREIGN PATENT DOCUMENTS

| | | |
|---|---|---|
| CN | 1744279 | 3/2006 |
| CN | 1945858 | 10/2006 |
| EP | 53090784 | 9/1978 |
| EP | 0204563 | 10/1986 |
| KR | 1020020077557 A | 10/2002 |
| KR | 100798430 | 1/2008 |
| WO | WO2004006293 | 1/2004 |

* cited by examiner

*Primary Examiner* — Michael Trinh
(74) *Attorney, Agent, or Firm* — The Belles Group, P.C.

(57) ABSTRACT

An annealing method of a zinc oxide thin film, comprises loading a substrate coated with a zinc oxide thin film into a chamber, allowing a hydrogen gas to be flowed into the chamber, fixing pressure in the chamber and annealing the zinc oxide thin film using the hydrogen gas in the chamber.

17 Claims, 3 Drawing Sheets

ANNEALING METHOD OF ZINC OXIDE THIN FILM

This application claims the benefit of Korean Patent Application No. 10-2008-0020120 filed on Mar. 4, 2008, which is hereby incorporated by reference.

BACKGROUND

1. Field

This embodiment relates to an annealing method of a zinc oxide thin film.

2. Description of the Related Art

Zinc oxide (ZnO) is used for a transparent conducting oxide (TCO), an emitter, nano quantum dot array, a nanorod, a nanobelt and the like in photoelectric devices such as a thin film solar cell, a thin film transistor liquid crystal display (TFT LCD), an organic electro luminescence device (OELD), a blue light emitting diode (LED) and a laser diode (LD).

The zinc oxide is a material which has n-type conduction by electrons because the Fermi level of the zinc oxide is located near the conduction band even though the zinc oxide is a nominally undoped thin film.

In a process of manufacturing a zinc oxide thin film used in a thin film solar cell, a TFT LCD, an OELD, an LED or the like, a wet cleansing process is frequently performed to protect the zinc oxide thin film from impurities.

Accordingly, moisture may remain in the zinc oxide thin film after the wet cleansing process. In this case, the remaining moisture ($H_2O$) may be easily absorbed on a grain boundary or surface of the zinc oxide thin film.

Moreover, when the zinc oxide thin film is formed using a chemical vapor deposition (CVD) process, $H_2O$ is used as a raw material gas. Therefore, $H_2O$ which is not reacted during the formation of the zinc oxide thin film may remain on the grain boundary or surface of the zinc oxide thin film.

As described above, $H_2O$ may remain in the zinc oxide thin film during the formation of the zinc oxide thin film or the wet cleansing process. In this case, when another thin film is deposited on the zinc oxide thin film, adhesion between the zinc oxide thin film and the another thin film is lowered, and therefore, the another thin film may be peeled off from the zinc oxide thin film.

Particularly, in a thin film solar cell, if moisture ($H_2O$) remaining in a transparent electrode formed of a zinc oxide thin film is diffused in a silicon layer, an open-circuit voltage is lowered, and therefore, conversion efficiency of the thin film solar cell may be degraded. Accordingly, it is very important to remove the moisture ($H_2O$) contained in the zinc oxide thin film for the purpose of manufacturing a thin film solar cell with high efficiency and high yield.

In an OELD, an organic film layer constituting a light emitting layer is deteriorated due to moisture ($H_2O$) remaining in a zinc oxide thin film, so that the lifetime of the OELD may be reduced or light emitting efficiency may be degraded. Therefore, it is very important to remove the moisture ($H_2O$) remaining in the zinc oxide thin film of the OELD for the purposed of improving characteristics of the OELD.

To remove moisture remaining in a zinc oxide thin film, a glass substrate on which a zinc oxide thin film is formed is loaded into a vacuum chamber, and the zinc oxide thin film is then annealed under a high vacuum state or an atmosphere of an inert gas such as nitrogen ($N_2$) or argon (Ar), thereby removing moisture ($H_2O$). However, the inert gas such as nitrogen ($N_2$) or argon (Ar) is not diffused at a relatively high speed in the vacuum chamber, and therefore, processing time may be delayed.

Further, the inert gas such as nitrogen ($N_2$) or argon (Ar) has a large molecular weight, and hence, it is not easy for the inert gas to be diffused through a grain boundary of the zinc oxide thin film. Therefore, the inert gas may not be effective to remove moisture absorbed on the grain boundary of the zinc oxide thin film.

Furthermore, the inert gas such as nitrogen ($N_2$) or argon (Ar) does not serve as a dopant of the zinc oxide thin film, and therefore, electrical characteristics of the zinc oxide thin film may not be improved.

SUMMARY

In one aspect, an annealing method of a zinc oxide thin film, comprises loading a substrate coated with a zinc oxide thin film into a chamber, allowing a hydrogen gas to be flowed into the chamber, fixing pressure in the chamber and annealing the zinc oxide thin film using the hydrogen gas in the chamber.

The pressure in the chamber in which the substrate may be loaded is 10-7 to 10-3 Torr.

The annealing method further comprises reducing the pressure in the chamber after the annealing.

The pressure in the chamber may be reduced as 10-7 to 10-3 Torr after the annealing.

The flux of the hydrogen gas may be 10 to 500 sccm.

The pressure in the chamber may be fixed as 0.3 to 5 Torr.

The temperature in the chamber may be 120 to 200° C. in the annealing.

The annealing may be performed for 3 to 60 minutes.

The zinc oxide thin film may include a dopant supplied from a group consisting of at least one of boron (B), aluminum (Al), gallium (Ga) and indium (In).

In another aspect, an method of manufacturing a solar cell, comprises loading a substrate having a zinc oxide thin film into a chamber, allowing a hydrogen gas to be flowed into the chamber, fixing pressure in the chamber and annealing the zinc oxide thin film using the hydrogen gas in the chamber.

The pressure in the chamber having the substrate loaded therein may be 10-7 to 10-3 Torr.

The method further comprises reducing the pressure in the chamber after the annealing.

The pressure in the chamber may be reduced as 10-7 to 10-3 Torr after the annealing.

The flux of the hydrogen gas may be 10 to 500 sccm.

The pressure in the chamber may be fixed as 0.3 to 5 Torr.

The temperature in the chamber may be 120 to 200° C. in the annealing.

The annealing may be performed for 3 to 60 minutes.

The zinc oxide thin film may include a dopant supplied from a group consisting of at least of boron (B), aluminum (Al), gallium (Ga) and indium (In).

BRIEF DESCRIPTION OF THE DRAWINGS

The embodiment will be described in detail with reference to the following drawings.

DETAILED DESCRIPTION OF EMBODIMENTS

Embodiments will be described in a more detailed manner with reference to the drawings.

Figure 1:
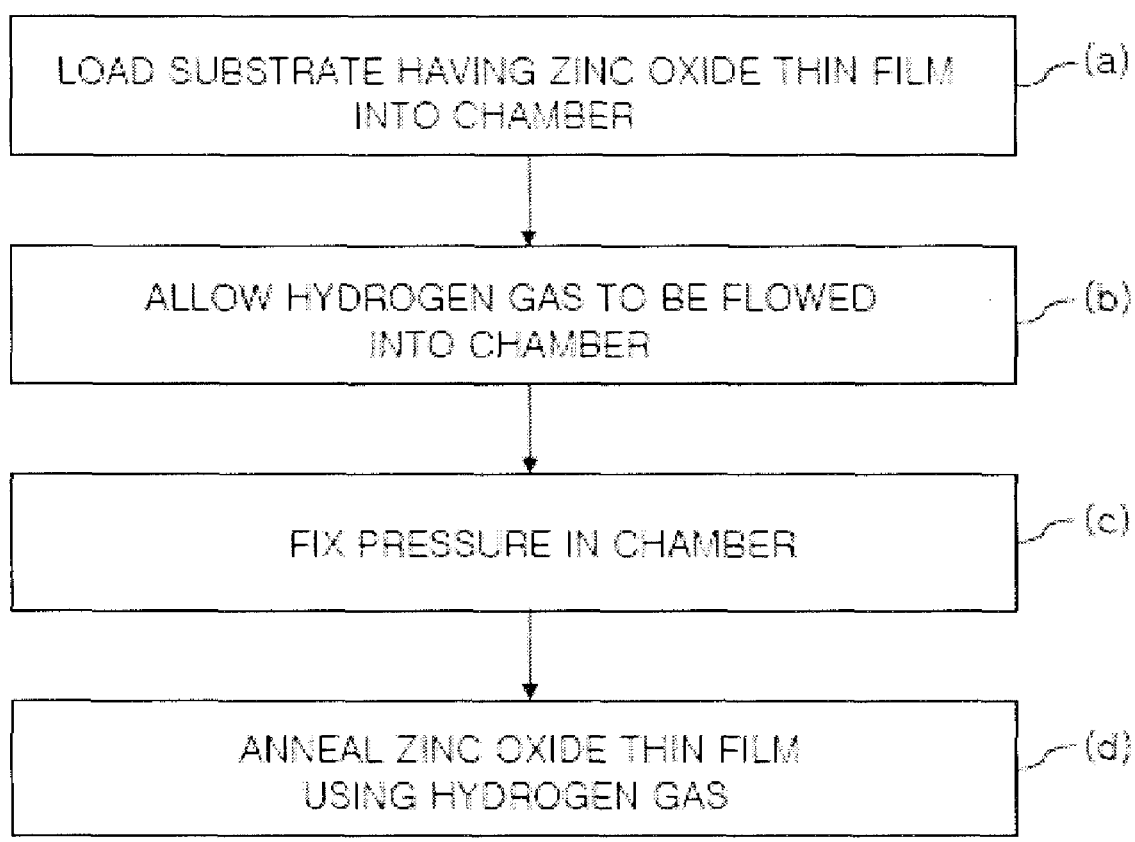
FIG. 1 is a flowchart illustrating an annealing method of a zinc oxide thin film according to an embodiment.
Figure 2:
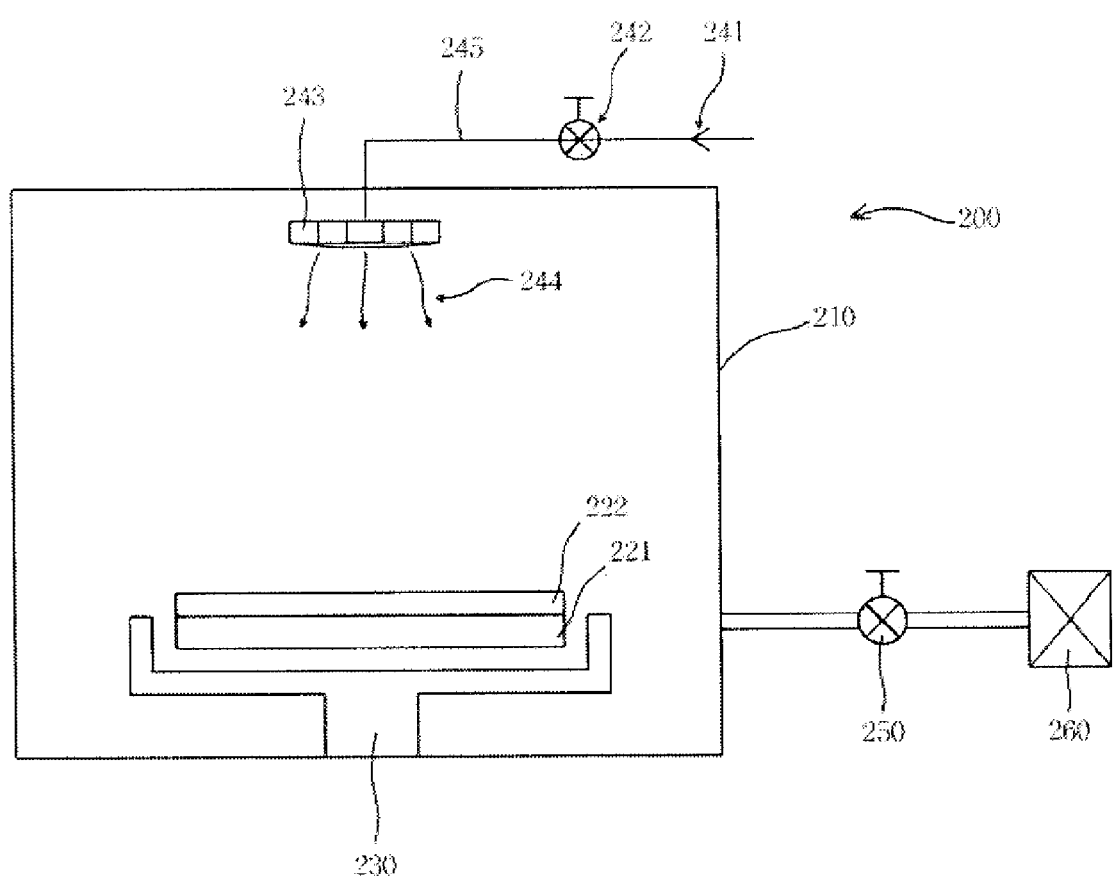
FIG. 2 is a view of an annealing apparatus of a zinc oxide thin film according to the embodiment.

FIG. 1 is a flowchart illustrating an annealing method of a zinc oxide thin film according to an embodiment. FIG. 2 is a view of an annealing apparatus 200 of a zinc oxide thin film according to the embodiment.

As shown in FIG. 2, the annealing apparatus 200 of the zinc oxide thin film comprises a chamber 210, a substrate support 230 on which a substrate 221 coated with a zinc oxide thin film 222 is loaded, a flux control valve 242, a hydrogen gas nozzle 243, an angle valve 250, a vacuum pump 260, and the like.

At step (a) of FIG. 1, the substrate 221 coated with the zinc oxide thin film 222 is loaded into the chamber 210.

When the substrate 221 is used in a thin film solar cell, the substrate 221 is a portion onto which light is incident. The substrate 221 may be made of a transparent insulative material so as to have excellent transmittance and to prevent a short circuit in the thin film solar cell. Meanwhile, a substrate 221 used in a device such as a thin film transistor liquid crystal display (TFT LCD), an organic electro luminescence device or a blue light emitting diode (LED) may also be made of a transparent insulative material so as to extract light generated inside the device to the outside thereof and to prevent a short circuit in the device. For example, the substrate 221 may include any one of a soda-lime glass, a normal glass or a tempered glass. A polymer substrate made of a polymer material may be used as the substrate 221. In addition, the substrate 221 may include a silicon substrate, a sapphire substrate or the like, which is not limited thereto.

The zinc oxide thin film 222 is formed on the substrate 221 by using a chemical vapor deposition (CVD) process or a sputtering process, which is not limited thereto but may be formed using a variety of processes.

For example, the zinc oxide thin film 222 may be formed using a photo-assisted low pressure metalorganic chemical vapor deposition (Photo-LP-MOCVD) process in which a mercury-sensitized photo-decomposition process is combined with a metalorganic chemical vapor deposition (MOCVD).

Meanwhile, the zinc oxide thin film 222 may include an n-type dopant supplied from a group consisting of at least one of boron (B), aluminum (Al), gallium (Ga) and indium (In). Alternatively, the zinc oxide thin film 222 may include hydrogen known as an n-type dopant (S. Y. Myong et al., Applied Physics Letters, 2003, Vol. 82, p. 3026-3028).

After the substrate 221 coated with the zinc oxide thin film 222 is loaded into the chamber 210, the pressure in the chamber 210 is controlled to be $10^{-7}$ to $10^{-3}$ Torr by an operation of the vacuum pump 260 and the angle valve 250 connected between the chamber 210 and the vacuum pump 260.

At step (b) of FIG. 1, a hydrogen gas 241 is flowed into the chamber 210.

The hydrogen gas 241 is supplied to the chamber 210 through a hydrogen gas supply line 245 connected to the chamber 210. The supplied hydrogen gas 241 is flowed into the chamber 210 through a hydrogen gas supply nozzle 243 installed in the chamber 210. The flux control valve 242 that controls the flux of the hydrogen gas 241 supplied to the chamber 210 is installed in the hydrogen gas supply line 245. The flux of the hydrogen gas 241 supplied to the chamber 210 through the flux control valve 242 is controlled to be 10 to 500 standard cubic centimeter per minute (sccm). The hydrogen gas 244 flowed into the chamber 210 functions to remove moisture contained in the zinc oxide thin film 222 in a subsequent annealing process.

If the flux of the hydrogen gas 244 flowed into the chamber 210 is below 10 sccm, the hydrogen gas 244 does not effectively remove moisture contained in the zinc oxide thin film 222, and an annealing time for removing moisture is extended.

If the flux of the hydrogen gas 244 flowed into the chamber 210 is over 500 sccm, the hydrogen gas 244 in a larger amount than is necessary is supplied to remove moisture contained in the zinc oxide thin film 222, and therefore, manufacturing cost may be increased.

At step (c) of FIG. 1, the pressure in the chamber 210 is fixed.

At step (a) of FIG. 1, the pressure in the chamber 210 is controlled to be $10^{-7}$ to $10^{-3}$ Torr. However, the hydrogen gas 241 is flowed into the chamber 210 at step (b), and therefore, the pressure in the chamber 210 is increased. If the pressure in the chamber 210 is not fixed in a certain range, it is likely that molecules of the hydrogen gas 244 flowed into the chamber 210 collide with one another, and therefore, moisture contained in the zinc oxide thin film 222 may not be effectively removed through the annealing process using the hydrogen gas 244. Accordingly, the pressure in the chamber 210 is fixed in a certain range.

The pressure in the chamber 210 is fixed using a pressure controller (not shown). The pressure controller fixes the pressure in the chamber 210 in a certain range by controlling the flux control valve 242 and the angle valve 250. Here, the flux control valve 242 controls the flux of the hydrogen gas 241 supplied to the chamber 210, and the angle valve 250 is connected between the chamber 210 and the vacuum pump 260.

The pressure in the chamber 210, fixed by the pressure controller, may be 0.3 to 5 Torr. If the pressure in the chamber 210 is smaller than 0.3 Torr, annealing efficiency is degraded due to the small flux of hydrogen, and therefore, an annealing time may be increased. If the pressure in the chamber 210 is greater than 5 Torr, an amount of hydrogen used is excessively increased, and therefore, manufacturing cost may be increased. That is, when the pressure in the chamber 210, fixed by the pressure controller, is 0.3 to 5 Torr, an increase of manufacturing cost can be prevented, and the annealing efficiency can be improved.

If the pressure in the chamber 210 is below 0.3 Torr, the pressure controller may control an amount of gas passing through the angle valve 250 to be maintained constant and controls the flux of the hydrogen gas 241 supplied to the chamber 210 through the flux control valve 242 to be increased. The pressure controller may control the flux of the hydrogen gas 241 flowed into the chamber 210 through the flux control valve 242 to be maintained constant and controls an amount of gas exhausted from the chamber 210 through the angle valve 250 to be decreased.

If the pressure in the chamber 210 is over 5 Torr, the pressure controller may control an amount of gas passing through the angle valve 250 to be maintained constant and may control the flux of the hydrogen gas 241 supplied to the chamber 210 through the flux control valve 242 to be decreased. The pressure controller may control the flux of the hydrogen gas 241 flowed into the chamber 210 through the flux control valve 242 to be maintained constant and controls an amount of gas exhausted from the chamber 210 through the angle valve 250 to be increased.

At step (d) of FIG. 1, the zinc oxide thin film 222 is annealed in the chamber 210 using the hydrogen gas 244.

The process of removing moisture contained in the zinc oxide thin film 222 using the hydrogen gas 244 is as follows.

The hydrogen gas 244 is rapidly diffused in the chamber 210 and the zinc oxide thin film 222. For this reason, if the zinc oxide thin film 222 is exposed to the hydrogen gas 244 at a predetermined temperature for a predetermined time, the hydrogen gas 244 reaches up to a depth of a few μm from a surface of the zinc oxide thin film 222. Hydrogen activated by heat in the chamber 210 is diffused into the zinc oxide thin film 222 through the surface and grain boundary of the zinc oxide thin film 222. The hydrogen diffused into the zinc oxide thin film 222 collides with moisture ($H_2O$) contained in the zinc oxide thin film 222 so that the moisture ($H_2O$) contained in the zinc oxide thin film 222 is separated from the zinc oxide thin film 222, or transfers heat to the moisture ($H_2O$) so that the moisture ($H_2O$) is spontaneously separated from the zinc oxide thin film 222.

The reason why the zinc oxide thin film 222 is annealed using the hydrogen gas 244 is that hydrogen gas ($H_2$) is diffused or thermally transferred faster than a gas such as nitrogen ($N_2$) or argon (Ar), and the moisture ($H_2O$) is effectively removed.

The following expression shows the Graham's diffusion law.

$$\frac{v_A}{v_B} = \sqrt{\frac{M_B}{M_A}} = \sqrt{\frac{d_B}{d_A}}$$

Here, "v" denotes a diffusion speed of gas A or B, "M" denotes a molecular weight of gas A or B, and "d" denotes a density of gas A or B. Accordingly, the diffusion speeds of hydrogen and nitrogen gases ($H_2$ and $N_2$) are compared as follows. Since the molecular weight of the hydrogen gas ($H_2$) is 2 and the molecular weight of the nitrogen gas ($N_2$) is 28, the hydrogen gas ($H_2$) is diffused about 3.74 times faster than the nitrogen gas ($N_2$), based on the aforementioned expression. As such, the hydrogen gas ($H_2$) is diffused faster than other gases except the hydrogen gas ($H_2$). Accordingly, the moisture contained in the zinc oxide thin film 222 can be effectively removed.

Meanwhile, the temperature in the chamber 210 may be 120 to 200° C. while performing the annealing process. If the temperature in the chamber 210 is below 120° C., the moisture ($H_2O$) contained in the zinc oxide thin film 222 is slightly removed, or the moisture ($H_2O$) contained in the zinc oxide thin film 222 is slowly removed for a long period of time. If the temperature in the chamber 210 is over 200° C., a shallow donor in ZnO (ZnO:H) is evoluted, and therefore, electrical conductivity of a zinc oxide thin film is lowered. Further, a zinc oxide (ZnO:B) thin film doped with boron (B) is discolored into yellow, and therefore, transmittance in the visual light region is lowered.

Accordingly, when the temperature in the chamber 210 is 120 to 200° C., the moisture ($H_2O$) contained in the zinc oxide thin film 222 can be effectively removed for a short period of time, and the electrical conductivity and transmittance of the zinc oxide thin film 222 can be maintained.

The time when the annealing process is performed using hydrogen gas may be 3 to 60 minutes. If the annealing time is below 3 minutes, the moisture ($H_2O$) contained in the zinc oxide thin film 222 is not sufficiently removed. If the annealing time is over 60 minutes, a time delay occurs in the annealing process. Accordingly, when the annealing time is 3 to 60 minutes, moisture can be effectively removed without a time delay.

After performing the annealing process, the substrate 221 coated with the zinc oxide thin film 222 is unloaded from the chamber 210, and subsequent semiconductor thin film processes are then performed.

Meanwhile, to maximize the effect for removing moisture ($H_2O$), a process may be additionally performed as follows.

Figure 3:
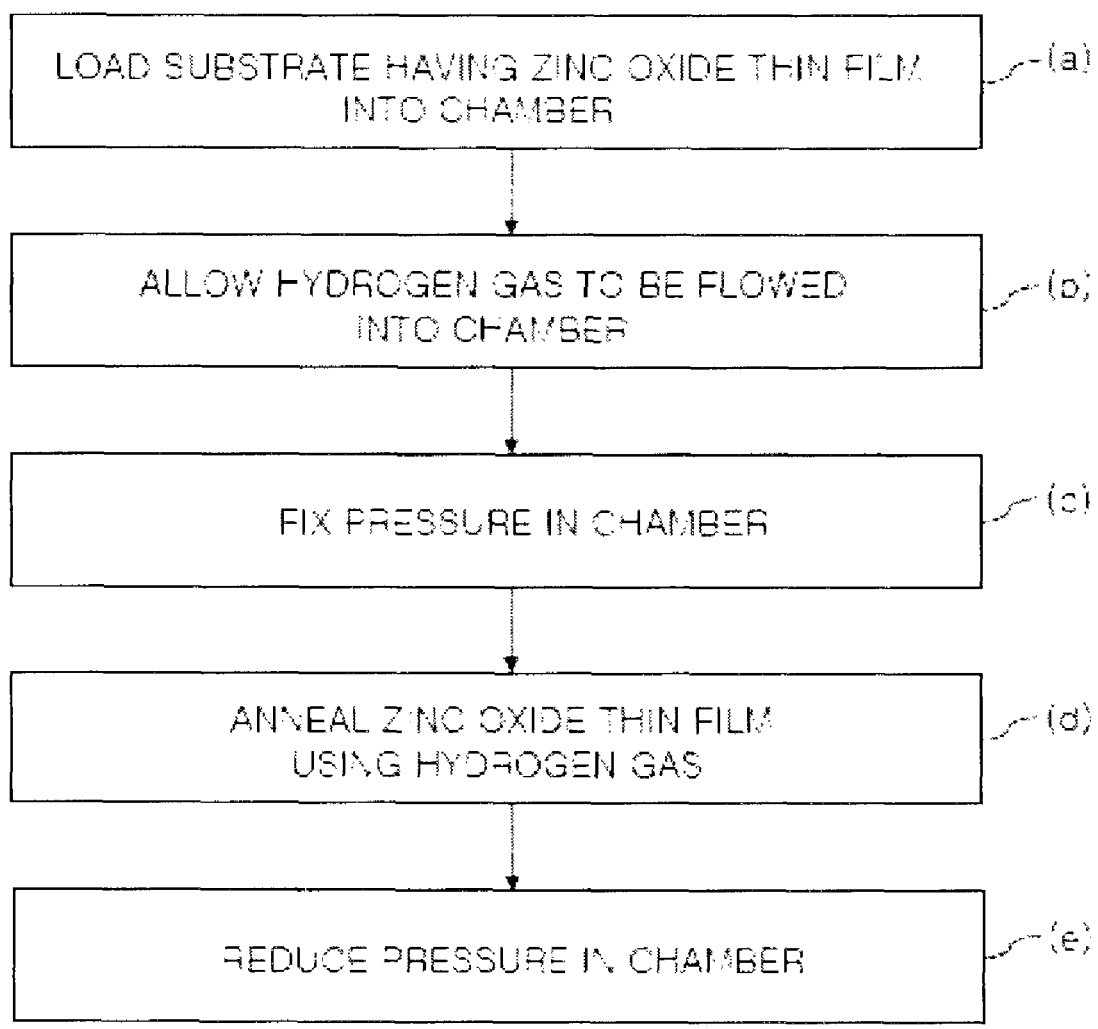
FIG. 3 is a flowchart illustrating an annealing method of a zinc oxide thin film according to another embodiment.

After processes are performed identically to steps (a) to (d) of FIG. 1, the pressure in the chamber 210 is reduced at step (e) of FIG. 3. The angle valve 250 is opened, and the pressure in the chamber 210 is controlled to be $10^{-7}$ to $10^{-3}$ Torr by an operation of the vacuum pump 260. Accordingly, after performing an annealing process, moisture ($H_2O$) remaining in the chamber 210 can be substantially removed completely.

Thereafter, the substrate 221 having the zinc oxide thin film 222 is unloaded from the chamber 210 for the purpose of subsequent processes.

Meanwhile, a zinc oxide thin film anneal according to the embodiments disclosed herein may be used for a transparent conducting oxide (TCO), an emitter, nano quantum dot array, a nanorod, a nanobelt and the like in photoelectric devices such as a thin film solar cell, a thin film transistor liquid crystal display (TFT LCD), an organic electro luminescence (OEL) device, a blue light emitting diode (LED) and a laser diode (LD), which is not limited thereto but may be applied in various ways.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A method of removing moisture from a zinc oxide thin film, comprising:
    loading a substrate coated with a zinc oxide thin film into a chamber, the zinc oxide thin film containing moisture;
    flowing a hydrogen gas into the chamber at a flux;
    fixing pressure at 0.3 to 5 Torr in the chamber; and
    annealing the zinc oxide thin film using the hydrogen gas in the chamber so that the hydrogen gas is activated and the activated hydrogen gas is diffused into the zinc oxide thin film, and wherein the moisture contained in the zinc oxide thin film is separated from the zinc oxide thin film through collision of the moisture and the activated hydrogen gas.

2. The method of removing moisture according to claim 1, wherein the chamber in which the substrate is loaded has a pressure in a range of $10^{-7}$ to $10^{-3}$ Torr.

3. The method of removing moisture according to claim 1, further comprising reducing the pressure in the chamber after the annealing.

4. The method of removing moisture according to claim 3, wherein the pressure in the chamber is reduced to $10^{-7}$ to $10^{-3}$ Torr after the annealing.

5. The method of removing moisture according to claim 1, wherein the flux of the hydrogen gas is 10 to 500 seem.

6. The method of removing moisture according to claim 1, wherein a temperature in the chamber is 120 to 200° C. during the annealing.

7. The method of removing moisture according to claim 1, wherein the annealing is performed for 3 to 60 minutes.

8. The method of removing moisture according to claim 1, wherein the zinc oxide thin film includes a dopant supplied from a group consisting of at least one of boron (B), aluminum (Al), gallium (Ga) and indium (In).

9. A method of manufacturing a solar cell, comprising:
loading a substrate having a zinc oxide thin film into a chamber, the zinc oxide thin film containing moisture;
flowing a hydrogen gas into the chamber at a flux;
fixing pressure at 0.3 to 5 Torr in the chamber; and
annealing the zinc oxide thin film using the hydrogen gas in the chamber so that the hydrogen gas is activated and the activated hydrogen gas is diffused into the zinc oxide thin film, and wherein the moisture contained in the zinc oxide thin film is separated from the zinc oxide thin film through collision of the moisture and the activated hydrogen gas.

10. The method according to claim 9, wherein the chamber in which the substrate is loaded has a pressure in a range of $10^{-7}$ to $10^{-3}$ Torr.

11. The method according to claim 9, further comprising reducing the pressure in the chamber after the annealing.

12. The method according to claim 11, wherein the pressure in the chamber is reduced to $10^{-7}$ to $10^{-3}$ Torr after the annealing.

13. The method according to claim 9, wherein the flux of the hydrogen gas is 10 to 500 sccm.

14. The method according to claim 9, wherein a temperature in the chamber is 120 to 200° C. during the annealing.

15. The method according to claim 9, wherein the annealing is performed for 3 to 60 minutes.

16. The method according to claim 9, wherein the zinc oxide thin film includes a dopant supplied from a group consisting of at least of boron (B), aluminum (Al), gallium (Ga) and indium (In).

17. A method of removing moisture from a zinc oxide thin film, comprising:
loading a substrate coated with a zinc oxide thin film into a chamber, the zinc oxide thin film containing moisture;
pressurizing the chamber at a first pressure range of $10^{-7}$ to $10^{-3}$ Torr;
flowing a hydrogen gas into the chamber at a flux in the range of 10 to 500 seem;
fixing the chamber at a second pressure range of 0.3 to 5 Torr; and
removing moisture from the zinc oxide thin film by annealing the zinc oxide thin film using the hydrogen gas in the chamber, the chamber set at a temperature in a range of 120-200° C., and wherein annealing comprises activating the hydrogen gas within the chamber with heat to diffuse the hydrogen gas into the zinc oxide thin film so that the moisture contained in the zinc oxide thin film is removed from the zinc oxide thin film through collision of the moisture and the activated hydrogen gas.

* * * * *